METHOD OF FORMING GROUP III-V COMPOUND PHOTOEMITTERS HAVING A HIGH QUANTUM EFFICIENCY AND LONG WAVELENGTH RESPONSE
Filed July 30, 1969 3 Sheets-Sheet 1

Inventor:
Donald L. Schaefer,
by John J. Kissane
His Attorney.

Inventor:
Donald L. Schaefer,
by John J. Kissane
His Attorney.

Inventor:
Donald L. Schaefer,
by John J. Kissane
His Attorney.

3,672,992

METHOD OF FORMING GROUP III–V COMPOUND PHOTOEMITTERS HAVING A HIGH QUANTUM EFFICIENCY AND LONG WAVELENGTH RESPONSE

Donald L. Schaefer, Skaneateles, N.Y., assignor to General Electric Company

Filed July 30, 1969, Ser. No. 846,155
Int. Cl. B44d *1/18*
U.S. Cl. 117—219 8 Claims

ABSTRACT OF THE DISCLOSURE

A photoemitter having a high quantum efficiency and a low work function for photoemission, i.e. photoelectric threshold, is formed by depositing a 10–100 A. film of a wide bandgap Group III–V compound, e.g. gallium phosphide, atop a 0.5–10 micron thick layer of a second Group III–V compound, e.g. gallium antimonide, having a bandgap matching the desired photoelectric threshold. The film surface then is treated with cesium (or cesium and oxygen) to reduce the surface work function of the composite structure to the desired photoelectric threshold. When the Group III–V layer forming the photoemitter is epitaxially grown atop an oriented substrate of a semiconductive material such as gallium arsenide having a bandgap wider than the bandgap of the overlying layer, the resulting photoemitter is transparent only in a range between the bandgap of the substrate and the bandgap of the overlying layer.

THE DISCLOSURE

Figures 1, 2, 3, 4:
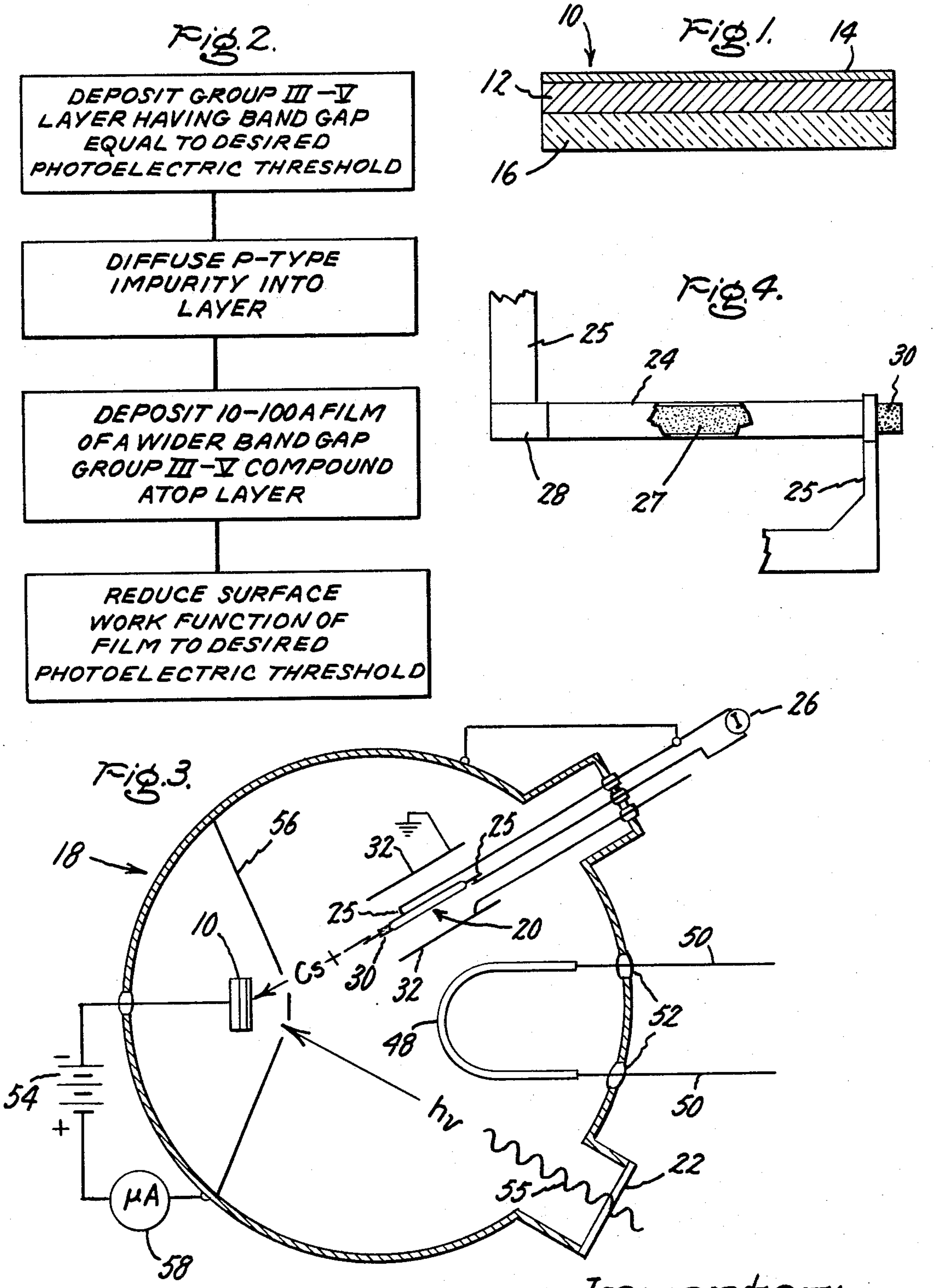

The present invention relates to high quantum efficiency Group III–V compound photoemitters having a long wavelength response and to the method of forming such photoemitters. In a more particular aspect, this invention relates to photoemitters formed by the deposition of a thin surface film of a wide bandgap Group III–V compound atop a layer of a second Group III–V compound (or alloy of Group III–V compounds) having a bandgap matching the desired photoelectric threshold whereupon the film is treated to reduce the surface work function of the composite structure to the desired photoelectric threshold.

Ideally an infrared photoemitter is characterized by a high quantum efficiency, e.g. 10% at 9,000 A., and a long wavelength threshold, e.g. greater than 9,000 A. However, photoemitters such as Cs-O-Ag photocathodes having the desired long wavelength response generally possess a quantum efficiently less than a few tenths of a percent at 9,000 A. (attributable to electron transitions for photoemission from a limited number of donor centers located near the conduction band) while high quantum efficiency photoemitters such as the $KNa_2Sb[Cs]$ photocathodes generally are characterized by a threshold wavelength below 9,000 A.

It heretofore has been reported by J. J. Scheer et al. in Solid State Communications, volume 3, pages 189–193, 1965, that high quantum efficiency photoemitters can be obtained only with direct transition semiconductors, e.g. gallium arsenide, wherein the required high density of filled electron states for photoemission is produced by direct transitions from the valence band to the conduction band. Because the surface work function of "clean" semiconductive surfaces characteristically produces a cutoff wavelength for photoemission near 3,000 A., the Solid State Communications article proposes irradiating the semiconductor surface with electropositive ions to form a dipole layer at the surface of the semiconductor to extend the photoelectric threshold wavelength. To maximize quantum yield while retaining a long wavelength response, however, ideally the surface work function of the semiconductor should be reduced to a level at least equal to the bandgap of the semiconductor forming the photoemitter. Because the obtainable reduced surface work function of the Group III–V compound semiconductors varies inversely with the bandgap of the semiconductor, indium phosphide irradiated with cesium and oxygen to reduce the surface work function to approximately 1.24 ev. heretofore has been suggested as an optimum Group III–V photoemitter for both high quantum efficiency and a long wavelength response.

It is therefore an object of this invention to provide a composite Group III–V compound infrared photoemitter having a high quantum efficiency and a long wavelength response.

It is also an object of this invention to provide a composite Group III–V semiconductive photoemitter having both a surface work function and a bandgap substantially below 1.0 ev.

It is a further object of this invention to provide a photoemitter transparent to light in a preselected range.

It is also an object of this invention to provide a novel method of fabricating a composite Group III–V photoemitter having both a surface work function and a bandgap substantially below 1.0 ev.

It is also an object of this invention to provide a novel method of fabricating ternary Group III–V semiconductive compounds.

These and other objects of this invention generally are achieved in a photoemitter formed by depositing a 10–100 A. film of a Group III–V compound atop a semiconductive layer of a second Group III–V compound having a bandgap equal to the desired photoelectric threshold for the photoemitter. Electropositive metal ions then are irradiated upon the Group III–V compound film surface to lower the surface work function substantially to the desired photoelectric threshold. In a particularly advantageous combination, the thin film of Group III–V compound material is selected from the group consisting of gallium phosphide and alloys thereof with other Group III–V compounds while the underlying layer of Group III–V material is a semiconductor selected from the group consisting of gallium antimonide, gallium arsenide and alloys of the foregoing with other Group III–V compounds. When the layer is epitaxially grown atop an oriented semiconductor having a bandgap wider than the layer, the photoemitter is transparent in a selected range determined by the difference between the bandgaps of the substrate and the overlying layer.

Figure 5:
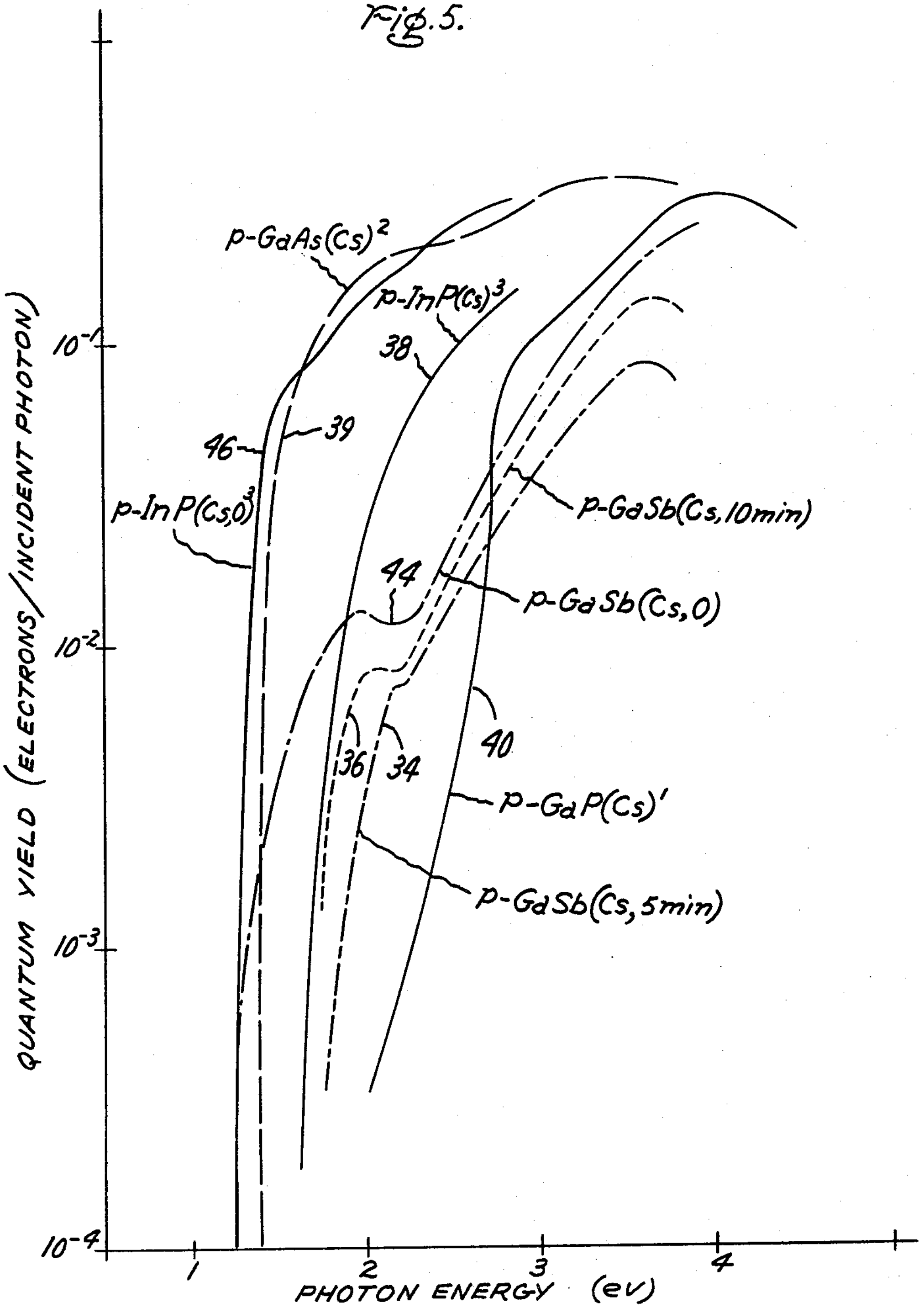
Figure 6:
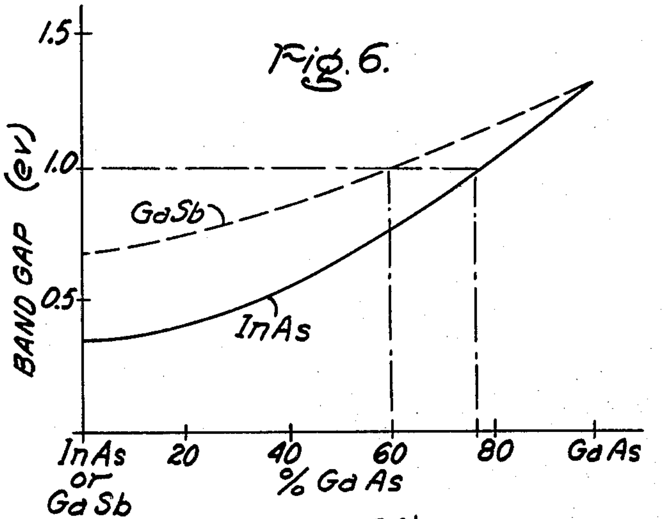
Figures 7, 8:
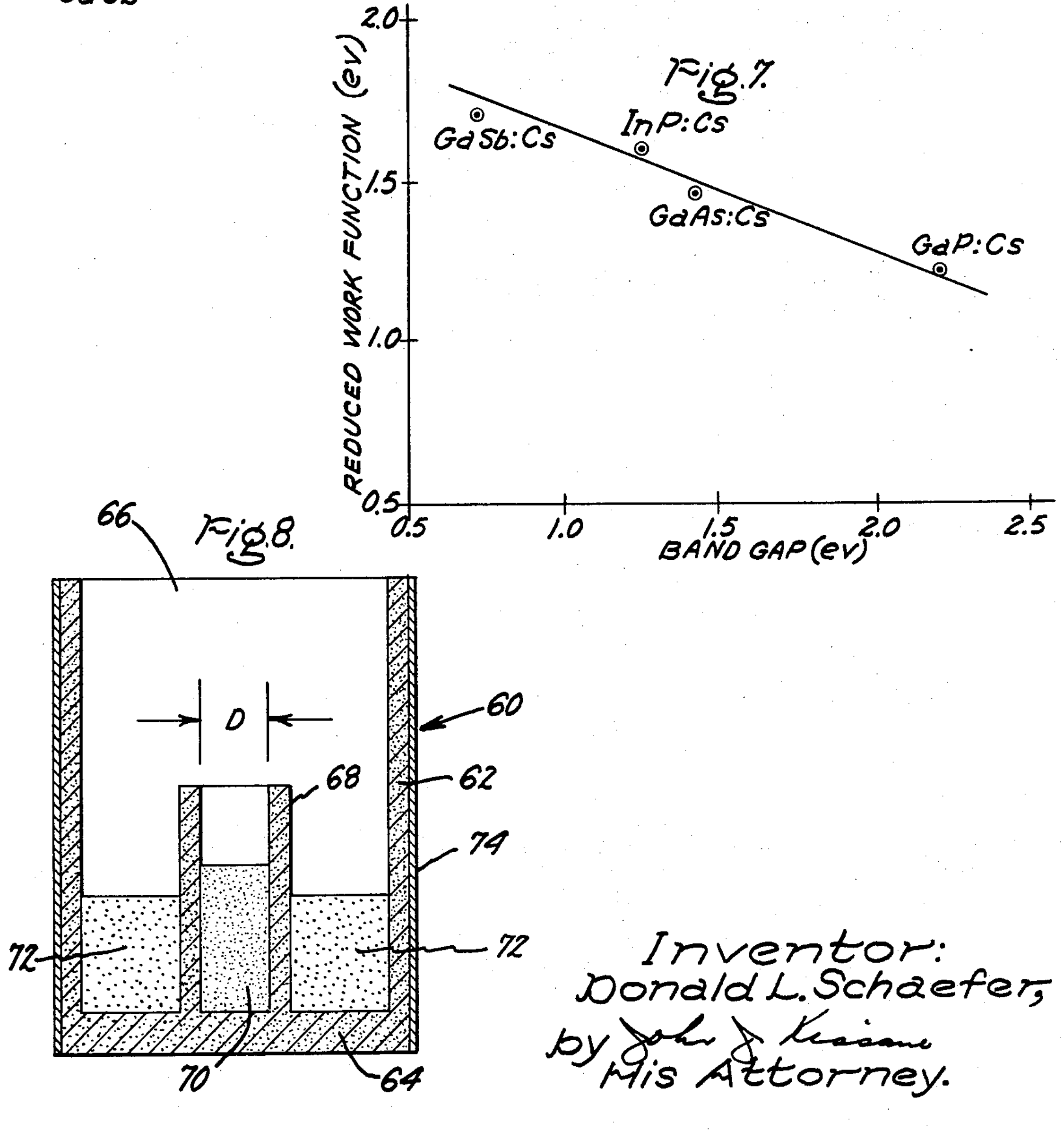

The novel features believed characteristic of the invention are set forth in the appended claims. The invention itself, together with further objects and advantages thereof may best be understood by reference to the following description taken in connection with the accompanying drawings, in which:

FIG. 1 is a sectional view of an infrared photoemitter formed in accordance with this invention, FIG. 2 is a flow chart illustrating in block diagram form the method of forming a photoemitter in accordance with this invention FIG. 3 is a sectional view of a chamber suitable for reducing the surface work function of the photoemitter to the desired photoelectric threshold, FIG. 4 is an enlarged, partially exposed view of the cesium ion source employed in the chamber of FIG. 3, FIG. 5 is a graph illustrating the photoelectric yield of variously treated Group III–V compounds, FIG. 6 is a graph depicting the variation in bandgap with the composition of various Group III–IV semiconductors, FIG. 7 is a graph illustrating the variation in reduced work function with bandgap for various cesium treated Group III–V compounds, and FIG. 8 is a sectional view of an evaporator suitable for forming ternary Group III–V compounds in accordance with this invention.

A photoemitter 10 formed in accordance with this invention is depicted in FIG. 1 and generally comprises a 0.5–10 micron thick layer 12 of a Group III–V compound, e.g. GaSb, GaInAs or GaAsSb, having a bandgap equal to the chosen photoelectric threshold of the photoemitter. Layer 12 is overlayed with a 10–100 A. film 14 of a second Group III–V compound, e.g. GaP, having a bandgap wider than the underlying layer and the surface of film 14 is treated with ions of an electropositive metal, such as cesium preferably in combination with oxygen (as will be more fully explained hereinafter), to reduce the surface work function of the composite photoemitter to the chosen photoelectric threshold.

As can be seen from the flow chart of FIG. 2, a gallium antimonide layer 12 can be formed by simultaneous vacuum evaporation of separate gallium and antimony sources to epitaxially grow the layer at a rate of 1,000 A.–2,000 A. per hour atop a suitable substrate 16 of, for example, highly polished 7056 optical quality borosilicate glass heated to a temperature between 400° C. and 470° C. To assure a high purity deposition, the vacuum chamber employed to form layer 12 initially is evacuated to at least approximately $1\times10^{-8}$ torr whereupon the separate gallium and antimony sources are heated to their respective vaporization temperatures with a shield overlying the glass substrate. When the pressure within the chamber has risen to between $1\times10^{-6}$ to $5\times10^{-7}$ torr due to evaporation of the sources, the shield is removed from atop the suitably heated glass substrate and a 0.5–10 micron thick gallium antimonide layer 12 is slowly deposited thereon. The layer then is doped highly p-type with a carrier concentration between $10^{17}$ and $10^{19}$ by any conventional technique, e.g. by maintaining the layer in a chamber containing zinc at 550° C. When substrate 16 is a semiconductor such as gallium arsenide, the substrate can be doped p-type prior to the epitaxial growth of the Group III–V compound layer thereon with subsequent heating of the laminar structure at 650° C. effecting a diffusion of the dopant from the substrate into the epitaxially grown layer.

After the doping of layer 12 to a high p-type conductively, a 10–100 A. thick film 14 of gallium phosphide is epitaxially grown at a rate of approximately 1,000 A. per hour atop the surface of layer 12 by the sequential vacuum evaporation of gallium and phosphorus sources at a pressure between $1\times10^{-6}$ to $5\times10^{-7}$ torr. Desirably layer 12 is heated to a temperature between 400° C. and 470° C. during deposition of film 14 to assure good crystal perfection at the interface between the layer and the overlying film.

Film 14, as deposited, characteristically has a surface work function significantly higher than the chosen photoelectric threshold of the underlying as determined by the bandgap of the layer. The surface work function of film 14 however must be susceptible to reduction to approximately the chosen photoelectric threshold by a treatment of the film surface which treatment includes the absorption of electropositive metal atoms into the film surface. For gallium phosphide films, the surface work function suitably is reduced to approximately the photoelectric threshold determined by the bandgap of gallium antimonide layer 12 by treating the film surface with both cesium and oxygen to reduce the surface work function of the film below a level achievable by cesium irradiation alone.

A particularly preferred structure for reducing the work function of film 14 to the desired photoelectric threshold is the stainless steel vacuum chamber 18 depicted in FIG. 3. Photoemitter 10 is mounted within the chamber in a confronting attitude relative to the ion generating nozzle of a cesium ion source 20 while a window 22 disposed within the sidewall of the chamber permits the impingement of light rays upon the photoemitter for testing purposes. Cesium ion source 20, illustrated more clearly in the enlarged view of FIG. 4, suitably can be a 0.05 inch diameter nickel tube 24 having a 0.003 thick sidewall to which tabs 25 are connected for resistively heating the tube by current from source 26 connected in series with the nickel tube. Tube 24 is at least partially filled with a finely divided mixture 27 of three parts by weight silicon with one part by weight cesium chromate prior to the sealing of the tube by pinching closed the tube end 28 remote from the photoemitter and inserting a plug 30 of 20% porosity tungsten within the end of the ion beam source confronting the photoemitter. When the cesium source is resistively heated to a temperature between 650° C. and 1,000° C. by current source 26, the silicon within tube 24 reacts with the comingled cesium chromate to liberate cesium which diffuses through the porous tungsten plug and evaporates from the tungsten surface as ions. At least one pair of suitably energized electrostatic plates 32 serve to focus the cesium ions evaporated from plug 30 upon the film surface of photoemitter 10 to maximize the efficiency of cesium ion source 20 while minimizing cesium contamination within the chamber. Because no reaction between the silicon and cesium chromate occurs below 400° C., chamber 18 can be baked at 400° C. and evacuated to a pressure less than $10^{-10}$ torr prior to cesiating film 14 to assure a high purity deposition or the cesium ions atop the film surface. In general, a heating current of approximately 8 amperes has been found to produce a saturated cesium ion current of approximately 2 microamperes.

FIG. 5 illustrates the alteration in the spectral response of various Group III–V semiconductive compounds by the incremental addition of cesium ions to the surface of the semiconductive compound at a rate of about $10^{13}$–$10^{14}$ cesium ions/cm.$^2$/minute. For cleaved p-type conductivity gallium antimonide crystals irradiated with cesium ions, the photoemission of the crystals rises rapidly as the surface work function decreases from an initial value of over 4 ev. for the cleaved p-type conductivity gallium antimonide surface to approximately 1.8 ev. and 1.7 ev. upon irradiation for periods of 5 and 10 minutes, illustrated by curves 34 and 36, respectively. A maximum sensitivity was reached after approximately 10 minutes with a surface coverage close to $10^{15}$/cm.$^2$ for a cesium sticking coefficient of one. Similarly, from the spectral response curves of cesiated p-type conductivity indium phosphide surfaces (curve 38), p-type conductivity gallium arsenide (curve 39) and p-type conductivity gallium phosphide surfaces (curve 40), the surface work functions of these materials are seen to be significantly decreased relative to the known work function of the clean surface (not shown).

A further reduction in the surface work function of the cesiated Group III–V compounds can be effected by an oxidation of the cesiated surface either simultaneously with, or subsequent to, irradiation of the surface with cesium ions. Thus, the spectral response of gallium antimonide is shifted from curve 36 to curve 44 upon oxidation of the cesiated surface while the spectral response of cesiated indium phosphide is shifted from curve 38 to curve 46 upon a slight oxidation of the cesium irradiated surface.

Because the surface work function of photoemitter 10 can be reduced by oxidation of film 14 subsequent to cesiating of the film surface, an oxygen source consisting of a silver tubing 48 filled with manganese dioxide is disposed within vacuum chamber 18 to eliminate the need for valves to introduce oxygen into the sealed chamber at a high vacuum. Silver tubing 48 suitably may be 0.06 inch in diameter with a 0.005 inch sidewall and is canted within the chamber to minimize sagging of the tubing when resistively heated through leads 50 extending through insulated bushings 52 in the chamber sidewall. When the tubing is resistively heated above 550° C. by a suitable current source (not shown), the manganese dioxide within the tubing decomposes generating oxygen which diffuses through the silver sidewall of the tubing into the vacuum chamber to oxidize the previously cesiated surface of the film 14. Desirably, reduction of the surface work function of the photoemitter 10 is accomplished by intermittently cesiating and oxidizing film 14 to effect a maximum reduction in surface work function although the surface work function photoemitter also can be reduced by two precisely controlled steps, e.g. initially cesiating the surface of film 14 and subsequently admitting oxygen into the chamber to reduce the work function of the photoemitter to a desired level.

During the reduction of the surface work function of film 14 to the photoelectric threshold determined by the bandgap of layer 12, photoemitter 10 preferably is negatively biased to a potential of approximately 300 volts by source 54 and light rays 55 from a tungsten source (not shown) admitted into the chamber through window 22 are irradiated upon the surface of the photoemitter to produce an electron emission therefrom. A metallic shield 56 electrically bonded to the stainless steel sidewall of the chamber shrouds the photoemitter and collects electrons emitted therefrom upon irradiation of the photoemitter with light rays 55 to produce a current flow measurable by ammeter 58 connected in series between the photoemitter and the sidewall of vacuum chamber 18. Cesium then is slowly, e.g. $10^{14}$ cesium ion/cm.$^2$/minute, evaporated from source 20 at a pressure less than $10^{-10}$ torr to impinge upon film 14 and the spectral response of the photoemitter to the impinging light rays is continuously monitored. When the quantum-yield of the photoemitter has been maximized by cesium impingement upon film 14, oxygen is gradually introduced in the chamber at a very low pressure, e.g. $10^{-8}$ torr, by resistively heating silver tubing 48 and the photoemission is allowed to rise to a new maximum. Should oxidation of the film surface continue beyond the maximum, cesium ion source 20 again is activated to restore the level of photoemission to the maximum.

Although the photoemitter of FIG. 1 has been specifically disclosed as having a cesium and oxygen treated gallium phosphide film overlying a gallium antimonide layer, layer 12 generally can be any Group III–V binary or ternary compound, although the small bandgap characteristic of gallium antimonide compounds make those compounds preferable for layer 12. Similarly film 14 can be any binary or ternary Group III–V compound having a surface work function which can be reduced to the photoelectric threshold determined by the bandgap of the underlying layer. In general, gallium and indium are preferred as the Group III metals forming either layer 12 or film 14, although aluminum also can be employed (primarily in a compound, e.g. aluminum phosphide, forming film 14) while phosphorus, arsenic, antimony and bismuth are preferred as the Group V elements forming the semiconductors of either layer. The exact choice of preferred material can vary however dependent upon the desired photoelectric threshold as can be seen from the graph of FIG. 6 illustrating the known variation in the bandgap of various Group III–V compound semiconductors with the weight percentage of the elements forming the semiconductor. Thus, when a photoelectric threshold corresponding to a bandgap of approximatelly 1.0 electron volts is desired, a ternary compound of $In_{.24}Ga_{.76}As$ or the ternary compound $GaSb_{.40}As_{.60}$ can be employed for layer 12. When a slightly different photoelectric threshold, e.g. 0.7 ev., is desired, the composition of layer 12 can be chosen of a semiconductor, e.g. GaSb or $In_{.50}Ga_{.50}As$, having a bandgap equal to the desired photoelectric threshold. However since both the surface work function (determined primarily by film 14) and bandgap (determined primarily by layer 12) limit the photoelectric threshold of photoemitter 10, the chosen photoelectric threshold (and bandgap of layer 12) should be set equal to the minimum level to which the surface work function of film 14 can be reduced by treating the film with electropositive ions or electropositive ions and oxygen.

As can be seen from the graph of FIG. 7, the reduced surface work function achievable with the various Group III–V compounds upon a cesium treatment varies inversely with the bandgap of the compound. For example, gallium antimony having a bandgap of approximately 0.7 ev. is characterized by a reduced work function after cesium irradiation of approximately 1.7 ev. while gallium phosphide having a bandgap of approximately 2.4 ev. exhibits a reduced surface work function of approximately 1.25 with cesium irradiation. The reduced surface work function however can further be reduced by a slight oxidation of the cesiated surface as explained heretofore during the discussion of the graphs of FIG. 5. Thus while the surface work function of gallium antimonide can be reduced to approximately 1.7 ev. by irradiation with cesium, the introduction of oxygen into vacuum chamber 18 after cesium irradiation of the photoemitter surface effects a reduction in the surface work function to approximately 1.25 e.v., e.g. a reduction in excess of 10%. Similarly the work function of other Group III–V compounds, e.g. polycrystalline $Ga_{.89}In_{11}As$ and InP, can be reduced to approximately 1.16 ev. and 1.25 ev., respectively, by a slight oxidation of the cesiated surface. To obtain a maximum long wavelength response with a maximum quantum efficiency, a gallium phosphide film is deposited atop a layer of a binary or ternary Group III–V compound having a bandgap equal to the reduced work function of the gallium phosphide after a cesium and oxygen treatment. The surface of the deposited film then is treated to produce a photoemitter having both a bandgap and work function equal to the desired photoelectric threshold.

When a ternary III–V compound, e.g. gallium indium arsenide, is desired to produce a layer having a bandgap equal to the reduced surface work function obtainable with the semiconductor forming film 14, a particularly advantageous technique for forming the ternary compound is by utilization of evaporator 60 depicted in FIG. 8. The evaporator generally comprises an outer graphite cylinder 62 having a closed lower end 64 and an open upper end 66 to permit the evaporation of the chosen sources into the vacuum chamber. A second graphite cylinder 68 is disposed concentrically within cylinder 62 to provide a reservoir for the indium source 70 while the gallium source 72 employed to form the ternary compound is contained within the moat formed between the sidewalls of the cylinders. Simultaneous evaporation of the metal sources then can be achieved by resistive heating of a 0.002 inch thick tantalum cylinder 74 circumferentially embracing the periphery of graphite cylinder 62.

In general, the composition of the evaporated compound from evaporator 60 is determined by the exposed surface area of each component within the evaporator with the particular dimensions of cylinders 62 and 68 preferably being chosen empirically after consideration of the desired semiconductor composition, the evaporation rates of the metals forming the semiconductor and the sticking coefficients of the metals at the chosen substrate temperature. For a substrate temperature of 450° C. to 470° C., $In_{.75}Ga_{.25}$ films have been deposited from a graphite evaporator having an outer cylinder 62 with a 0.6 inch inside diameter and an inner cylinder with a 0.75 inch inside diameter and a sidewall thickness of .067 inch. To vary the composition of the deposited material, the wall thickness of inner cylinder 68 was increased inwardly to limit the diameter of the indium reservoir contained within the inner cylinder. Thus, $In_{0.4}Ga_{0.6}$ films were deposited by a reduction of the inside diameter D of inner cylinder 68 to 0.12 inch while films of $In_{0.25}Ga_{0.75}$ were deposited upon reduction of the internal diameter of the inner cylinder to 0.075 inch. Because the heats of vaporization of gallium and indium are nearly identical, any change in the evaporator temperature results almost entirely in a change in the evaporation rate of the metals without substantially affecting the evaporant composition. Although the difference in vapor pressure between indium and gallium (200 to 1) would seem to indicate the necessity for a wide disparity between the diameters of cylinders 62 and 68, the sticking coefficient for indium on a 450° C. substrate is low compared to the sticking coefficient of gallium upon the substrate. Thus a substantially higher indium flux is required for a chosen alloy composition than the proportion determined solely by the vapor pressures of the metals. For alloy compositions other than the indium-gallium compositions shown in the specific examples, the internal diameter of inner cylinder 68 best is determined empirically upon observation of the obtainable compositions utilizing cylinders of diverse diameters.

By use of evaporator 60, only the temperature of the substrate on which the film is deposited, the temperature of the Group V source and the temperature of the evaporator containing the Group III metals need be controlled during the formation of a ternary Group III–V compound rather than the conventional simultaneous control of the temperatures of the three sources forming the ternary compound and the substrate. Moreover because films of high crystal perfection must be deposited slowly, e.g. at a rate of 1,000 to 2,000 A. per hour using an evaporator temperature of approximately 800° C. for indium and gallium sources, the use of separate evaporators for the metal sources would require precise control of the source temperature for several hours to obtain the desired ternary compound.

When substrate 16 employed for the formation of the photoemitter of this invention is glass, e.g. 7056 borosilicate glass, a transparent photoemitter is produced and light rays can be irradiated through the substrate. If the substrate however is a semiconductive material having a wider bandgap than layer 12, a transparent photoemitter is obtained only in the wavelength range between the bandgap of the substrate and layer 12. Thus the combination of a wide bandgap substrate and a narrower bandgap overlying layer functions to effectively filter light rays except for those rays lying between the photoelectric threshold of the substrate and overlying layer.

When substrate 16 is a semiconductor such as germanium, a reflective photocathode is produced. The germanium however advantageously can be highly doped to a p-type conductivity prior to the deposition of the small bandgap layer thereon to permit subsequent diffusion of the dopant from the substrate into the layer. Thus the techniques of this invention not only provide the ability to produce a transparent photoemitter but also permit photoemitters to be formed by techniques other than cleaving a single crystal wherein relatively large (1 cm. by 1 cm.) crystals are required and the cleaved surface must be close to perfection.

What I claim as new and desire to secure by Letters Patent of the United States is:

1. A method of forming a photoemitter with an improved infrared response comprising: depositing onto a substrate within an evaporation chamber a semiconductive layer of a Group III–V compound having a bandgap equal to the photoelectric threshold of said Group III–V compound, depositing a 10–100 A. film of a second III–V compound atop said layer, said second III–V compound having a bandgap wider than the bandgap of said underlying semiconductive layer, and impinging cesium ions upon said film to lower the surface work function of said photoemitter to said photoelectric threshold.

2. A method of forming a photoemitter according to claim 1 wherein said Group III–V layer is epitaxially grown atop a semiconductive substrate having a bandgap wider than the bandgap of said layer.

3. A method of forming a photoemitter according to claim 1 wherein said layer is a semiconductor consisting essentially of gallium antimonide and said film of second Group III–V compound is aluminum phosphide.

4. A method of forming a photoemitter according to claim 1 wherein said layer is a semiconductor selected from the group consisting of gallium antimonide, gallium arsenide and alloys thereof and said film consists essentially of gallium phosphide.

5. A method of forming a photoemitter according to claim 4 wherein further including oxidizing the surface of said cesiated film to further reduce the work function thereof.

6. A method of forming a photoemitter according to claim 5 wherein said cesium is diffused through a porous metallic plug sealing one end of an elonged tube, said tube containing cesium chromate and silicon for releasing cesium when heated above 400° C.

7. A method of forming a photoemitter according to claim 5 wherein said semiconductive layer is a ternary Group III–V compound formed by simultaneously evaporating at least two elements of said layer from a common evaporator, said two elements being disposed in reservoirs having an exposed surface area in the same ratio as said two elements in the resulting Group III–V layer.

8. A method of forming a photoemitter according to claim 5 wherein said oxygen is emitted to the chamber through the sidewalls of a silver tube containing manganese dioxide for releasing oxygen when heated above 450° C.

References Cited

UNITED STATES PATENTS

| | | | |
|---|---|---|---|
| 2,759,861 | 8/1956 | Collins et al. | 117—107 X |
| 3,023,131 | 2/1962 | Cassman | 117—219 X |
| 3,117,022 | 1/1964 | Bronson et al. | 117—93.3 X |
| 3,179,835 | 4/1965 | Kaseman | 117—219 X |
| 3,244,557 | 4/1966 | Chiou et al. | 117—107 X |
| 3,322,575 | 5/1967 | Ruehrwein | 136—89 |
| 3,387,161 | 4/1968 | Laar et al. | 317—235 N |
| 3,411,946 | 11/1968 | Tramposch | 117—106 X |
| 3,478,213 | 11/1969 | Simon et al. | 317—235 N |
| 3,520,741 | 7/1970 | Mankarious | 117—93.3 X |
| 3,575,628 | 4/1971 | Word | 313—94 |

ALFRED L. LEAVITT, Primary Examiner

C. K. WEIFFENBACH, Assistant Examiner

U.S. Cl. X.R.

117—93.3, 106 A, 211, 215; 313—65 R, AB, T, 94,; 317—235 N